United States Patent [19]

Weinberg et al.

[11] Patent Number: 5,700,401
[45] Date of Patent: Dec. 23, 1997

[54] LIQUID AUTO-LEVEL APPARATUS AND METHOD

[75] Inventors: Richard S. Weinberg, Palo Alto; James W. Thomas, Los Altos, both of Calif.

[73] Assignee: Microbar Systems, Inc., Santa Clara, Calif.

[21] Appl. No.: 577,560

[22] Filed: Dec. 22, 1995

[51] Int. Cl.$^6$ ............... B67D 5/08; B01D 47/00
[52] U.S. Cl. ............... 261/27; 261/26; 261/37; 261/72.1; 261/77; 261/121.1; 222/56; 222/64
[58] Field of Search .............. 261/26, 27, 34.1, 261/37, 72.1, 77, 121.1, DIG. 68; 222/56, 64, 65, 67, 68

[56] References Cited

U.S. PATENT DOCUMENTS

| | | | |
|---|---|---|---|
| 3,051,192 | 8/1962 | Fagot et al. | 137/391 |
| 3,322,957 | 5/1967 | Scoggin | 250/218 |
| 3,876,107 | 4/1975 | Meindl et al. | 222/64 |
| 4,014,461 | 3/1977 | Harvill | 222/94 |
| 4,106,671 | 8/1978 | Sharples | 222/61 |
| 4,247,018 | 1/1981 | Credle | 222/1 |
| 4,275,823 | 6/1981 | Credle, Jr. | 222/94 |
| 4,319,568 | 3/1982 | Tregoning | 128/214 |
| 4,493,435 | 1/1985 | Hartley | 222/136 |
| 4,560,089 | 12/1985 | McMillan et al. | 222/14 |
| 4,601,409 | 7/1986 | DiRegolo | 222/1 |
| 4,728,005 | 3/1988 | Jacobs et al. | 222/64 |
| 5,293,893 | 3/1994 | O'Dougherty | 137/113 |
| 5,316,181 | 5/1994 | Burch | 222/61 |
| 5,383,574 | 1/1995 | Raphael | 222/64 |
| 5,405,443 | 4/1995 | Akimoto et al. | 222/64 |
| 5,480,063 | 1/1996 | Keyes et al. | 222/64 |

FOREIGN PATENT DOCUMENTS 26 20 117  11/1977  Germany .

Primary Examiner—Khanh P. Nguyen
Attorney, Agent, or Firm—Flehr Hohbach Test Albritton & Herbert LLP

[57] ABSTRACT

An HMDS tank for use in an integrated circuit fabrication process includes a tank configured to hold HMDS having an first inlet port configured to receive a carrier gas below an HMDS surface level, an outlet port configured to release said carrier gas saturated with HMDS above the HMDS surface level, and a second inlet port configured to receive HMDS. A sensor is positioned in the tank at a predetermined HMDS level and configured to generate a sensor signal when the HMDS surface level falls below the predetermined HMDS level. A processor is coupled to the sensor and configured to generate a fill signal in response to the sensor signal to initiate introduction of HMDS into the tank through the second inlet port. In another embodiment, the HMDS tank further includes a second sensor positioned in the tank at a low HMDS level. The processor is also coupled to the second sensor and configured to generate an alarm signal in response to the second sensor signal to warn an operator of a low HMDS level in the tank. The alarm signal can instruct the integrated circuit fabrication process to halt until corrective action is taken. An advantage of the invention includes a substantially constant HMDS level that in turn provides a substantially constant concentration of HMDS in the carrier gas which is delivered to the integrated circuit fabrication process. Additional advantages include increased integrated circuit fabrication up-time, reduced contamination and improved efficiency and continuity of the integrated circuit fabrication process.

20 Claims, 3 Drawing Sheets

LIQUID AUTO-LEVEL APPARATUS AND METHOD

FIELD

The present invention relates to an HMDS auto-level apparatus and method. In particular, the present invention is used in an integrated circuit fabrication process to insure that a substantially constant level of HMDS is maintained in an HMDS tank in order to provide a substantially constant concentration of HMDS in a carrier gas which is delivered to the integrated circuit fabrication process.

BACKGROUND

Integrated circuit fabrication includes many steps. In one step of the fabrication process, silicon wafers are typically processed using a continuous stream of hexamethyldisilizane (HMDS). HMDS serves to cleanse the wafers and prepare the wafers for further processing.

A typical process depicted in FIG. 1 includes an HMDS tank 10 that stores HMDS. Pressurized nitrogen carrier gas is introduced into tank 10 through a tube 12 at typically 5–15 pounds per square inch. The carrier gas bubbles through the HMDS in tank 10 and becomes concentrated with HMDS. The pressurized carrier gas concentrated with HMDS is delivered to the integrated circuit fabrication process through tube 14.

During the fabrication process, HMDS becomes depleted and periodically needs replenishment. Sensors are positioned in tank 10 to monitor the HMDS level. A high sensor 16 positioned near the top of tank 10 indicates when the HMDS is full. A low sensor 18 is positioned near the bottom of tank 10 indicates when the HMDS is low and needs replenishment.

In one known replenishment technique, when the HMDS reaches the low mark, an alarm is activated, manufacturing stops, pressurized tank 10 is vented and lid 20 is opened. Additional HMDS is poured into tank 10 by a human operator 22, and then the fabrication process is restated by pressurizing the vessel and continuing to manufacture more semiconductor wafers.

In a second known replenishment technique, HMDS in tank 10 is refilled by reducing the pressure in tank 10 by pulling on a vacuum hose. This technique also requires that the manufacture process stop because the carrier gas concentrated with HMDS cannot be supplied until tank 10 is re-pressurized to a positive pressure.

The disruptions to the manufacturing process required by the known HMDS replenishment techniques are highly undesirable and create several problems. First, the HMDS concentration in the carrier gas is a function of the HMDS level. A high HMDS level provides a high concentration of HMDS in the carrier gas (e.g. saturation), while a low HMDS level provides a low concentration of HMDS in the carrier gas. By changing the HMDS level during the integrated circuit fabrication, from a low level to a high level, the resulting HMDS concentration in the carrier gas differs before and after the HMDS replenishment. This change in HMDS concentration in the carrier gas causes undesirable variations during integrated circuit fabrication. Second, the manual refill of tank 10 exposes the HMDS to air in an uncontrolled fashion, and by pouring HMDS into tank 10 in a turbulent manner, additional gases are entrained into the HMDS. This causes process variations because the concentration of HMDS in the carrier gas differs before and after the HMDS replenishment. Third, manual refilling exposes a human operator to the HMDS. While HMDS is not highly toxic, unnecessary exposure may cause operator discomfort and should be avoided. Other problems are also inherent in the known replenishment techniques. These problems cause process variations during the integrated circuit fabrication process and result in sub-optimal integrated circuit wafer production.

SUMMARY

The present invention relates to an HMDS auto-level apparatus and method. In particular, the present invention is used in an integrated circuit fabrication process to insure that a substantially constant level of HMDS is maintained in an HMDS tank in order to provide a substantially constant concentration of HMDS in the carrier gas which is delivered to the integrated circuit fabrication process.

An embodiment of an HMDS tank for use in an integrated circuit fabrication process includes a tank configured to hold HMDS having an first inlet port configured to receive a carrier gas below an HMDS surface level, an outlet port configured to release said carrier gas concentrated with HMDS above the HMDS surface level, and a second inlet port configured to receive HMDS. A sensor is positioned in the tank at a predetermined HMDS level and configured to generate a sensor signal when the HMDS surface level falls below the predetermined HMDS level. A processor is coupled to the sensor and configured to generate a fill signal in response to the sensor signal to initiate introduction of HMDS into the tank through the second inlet port.

In another embodiment, the HMDS tank further includes a low sensor positioned in the tank at a low HMDS level. The processor is also coupled to the low sensor and configured to generate an alarm signal in response to the low sensor signal to warn an operator of a low HMDS level in the tank. The alarm signal can further instruct the integrated circuit fabrication process to halt until corrective action is taken.

In another embodiment, the HMDS tank further includes a high sensor positioned in the tank at a high HMDS level. The processor is also coupled to the high sensor and configured to generate an alarm signal in response to the high sensor signal to warn an operator of a high HMDS level in the tank. The alarm signal can further instruct the integrated circuit fabrication process to halt until corrective action is taken.

An advantage of the invention includes a substantially constant HMDS level that in turn provides a substantially constant concentration of HMDS in the carrier gas which is delivered to the integrated circuit fabrication process. Additional advantages include increased integrated circuit fabrication up-time, reduced contamination and improved efficiency and continuity of the integrated circuit fabrication process. Moreover, the invention avoids human exposure to the HMDS.

BRIEF DESCRIPTION OF THE DRAWINGS

Additional advantages of the invention will become apparent upon reading the following detailed description and upon reference to the drawings, in which.

DETAILED DESCRIPTION

The present invention relates to an HMDS auto-level apparatus and method. In particular, the present invention is used in an integrated circuit fabrication process to insure that a substantially constant level of HMDS is maintained in an HMDS tank in order to provide a substantially constant concentration of HMDS in the carrier gas which is delivered to the integrated circuit fabrication process.

Exemplary embodiments are described herein with reference to specific configurations. Those skilled in the art will appreciate that various changes and modifications can be made to the exemplary embodiments while remaining within the scope of the present invention.

Figure 1:
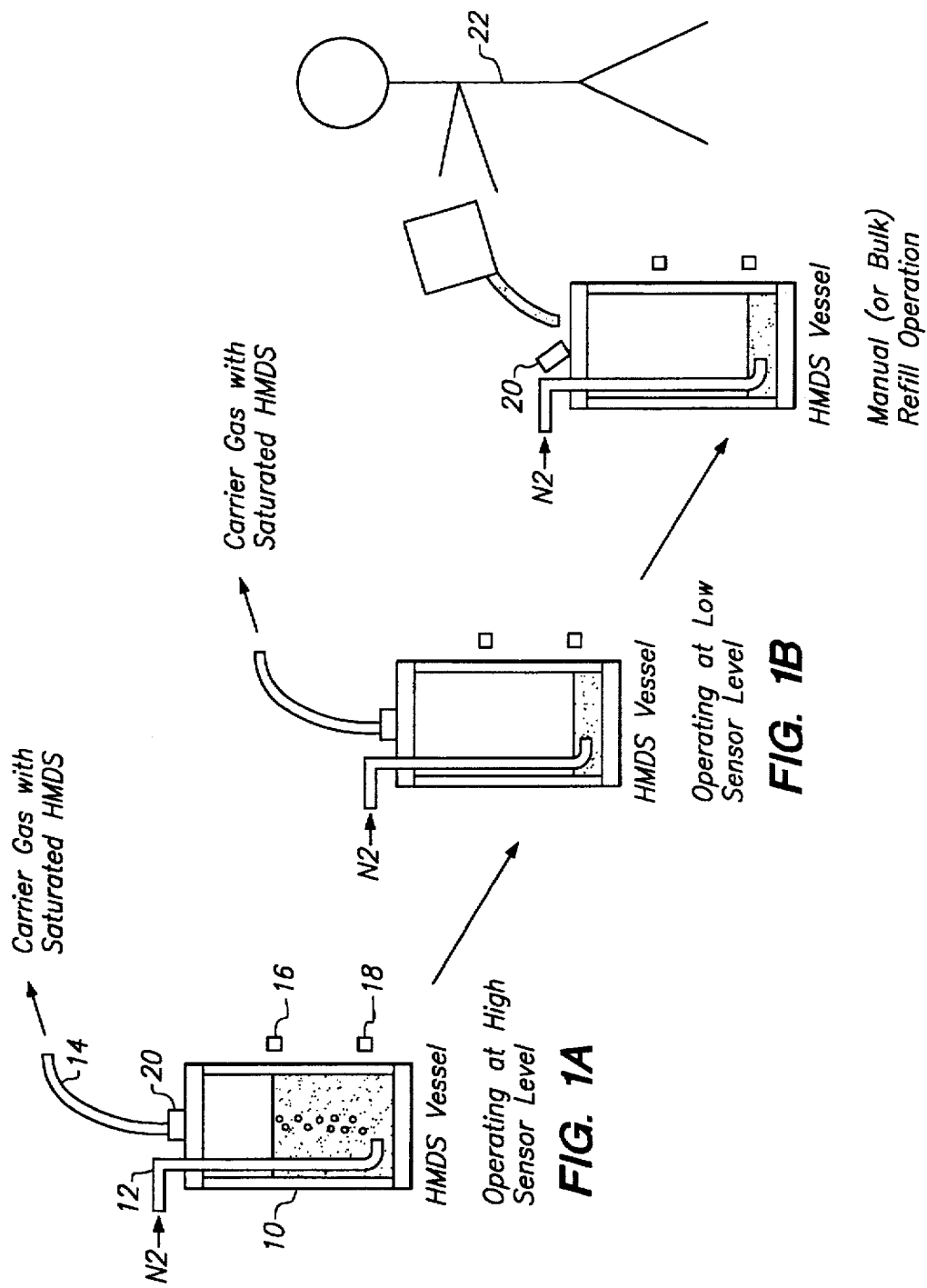
FIGS. 1A–C depict an HMDS tank according to the prior art.
Figure 2:
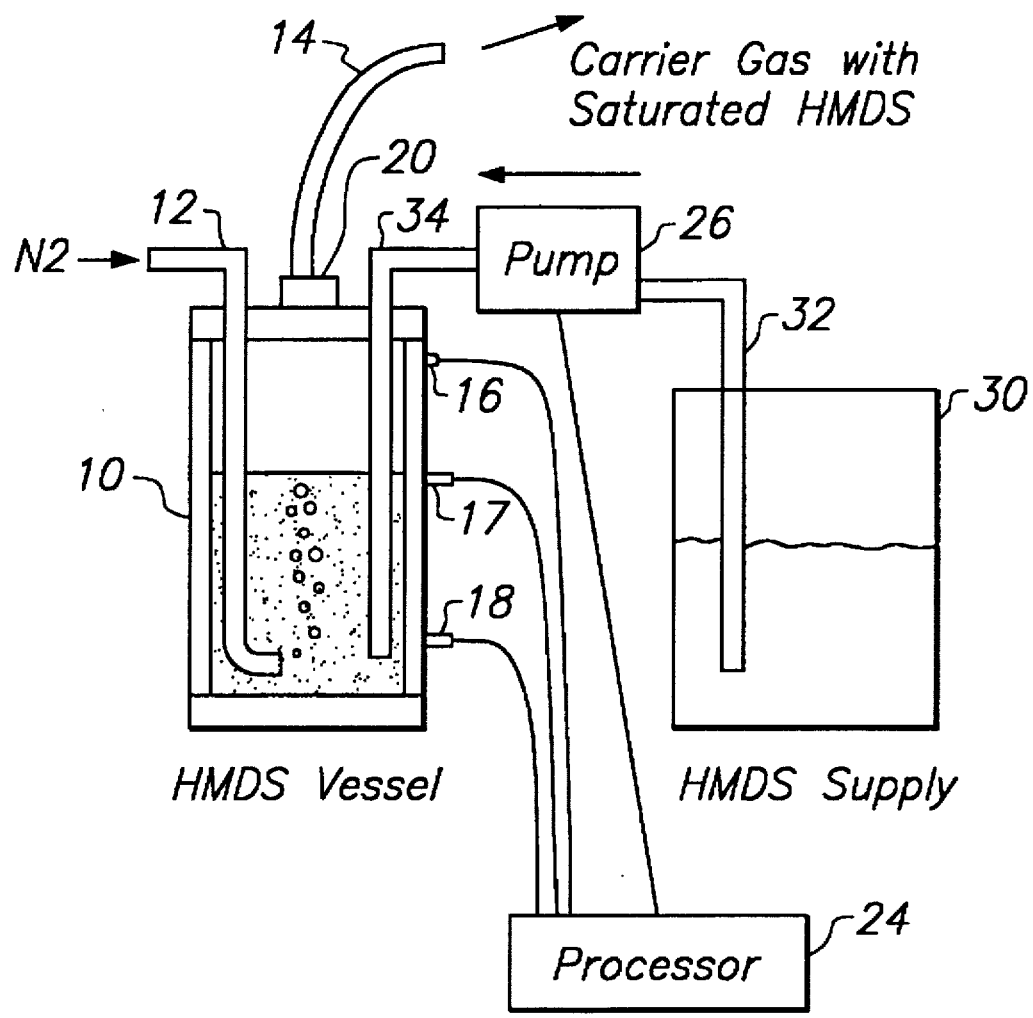
FIG. 2 depicts an HMDS tank according to an embodiment of the invention.

A first embodiment is described with reference to FIG. 2. A tank 10 is similar to that described above. Tank 10 has an inlet for tube 12 that permits the introduction of a carrier gas into tank 10. Similarly, tank 10 has an outlet for tube 14 that delivers the carrier gas concentrated with HMDS to the integrated circuit fabrication process. An optimal level sensor 17 is positioned at a predetermined level in tank 10 and is coupled to a processor 24 that continuously receives a full level sensor signal when the HMDS level is above sensor 17. When the HMDS level falls below the predetermined level, sensor 17 generates a fill sensor signal. Based on the fill sensor signal, processor 24 commands pump 26 to slowly transfer HMDS from HMDS reserve tank 30 via tubes 32 and 34 to tank 10. The slow transfer of HMDS provides the benefits that the pressure in tank 10 is not rapidly varied, and the concentration of HMDS in the carrier gas is not rapidly varied. The slow transfer promotes continuity in the fabrication process. When the HMDS level again rises above the predetermined level, sensor 17 generates a full sensor signal. Based on the full sensor signal, processor 24 commands pump 26 to halt. This way, the HMDS level in tank 10 is constantly maintained near the predetermined level and, hence, a constant path length of the carrier gas through the HMDS is constantly maintained. For example, the level can be maintained at the predetermined level to insure that the carrier gas is consistently saturated with HMDS.

Another embodiment employs a low sensor 18 positioned at a low level in tank 10. If the HMDS level falls below the low sensor position, an alarm sounds to warn an operator of a low HMDS level. For example, if the pump malfunctions or if the reserve tank becomes empty, the low sensor signal warns the operator and the necessary repairs can be made to the system. In many cases, the fabrication process need not stop and can continue while the malfunction is being repaired. For example, the reserve tank can be filled or the pump can be repaired while the fabrication process continues. In other cases, the fabrication process can be halted to avoid a process problem.

Another embodiment employs a high sensor 16 positioned at a high level in tank 10. If the HMDS level rises above the high sensor position, an alarm sounds to warn an operator of a high HMDS level. For example, if the pump malfunctions and continues to pump even with the full sensor signal, the high sensor signal warns the operator and the necessary repairs can be made to the system. In many cases, the fabrication process need not stop and can continue while the malfunction is being repaired. For example, the pump can be repaired while the fabrication process continues. In other cases, the fabrication process can be halted to avoid a process problem.

Another embodiment employs a plurality of sensors to provide accurate information regarding the position of the HMDS level in tank 10. This permits processor 24 to accurately control the HMDS level in tank 10, and for an alarm to sound if the HMDS level becomes excessively low or excessively high.

Figure 3:
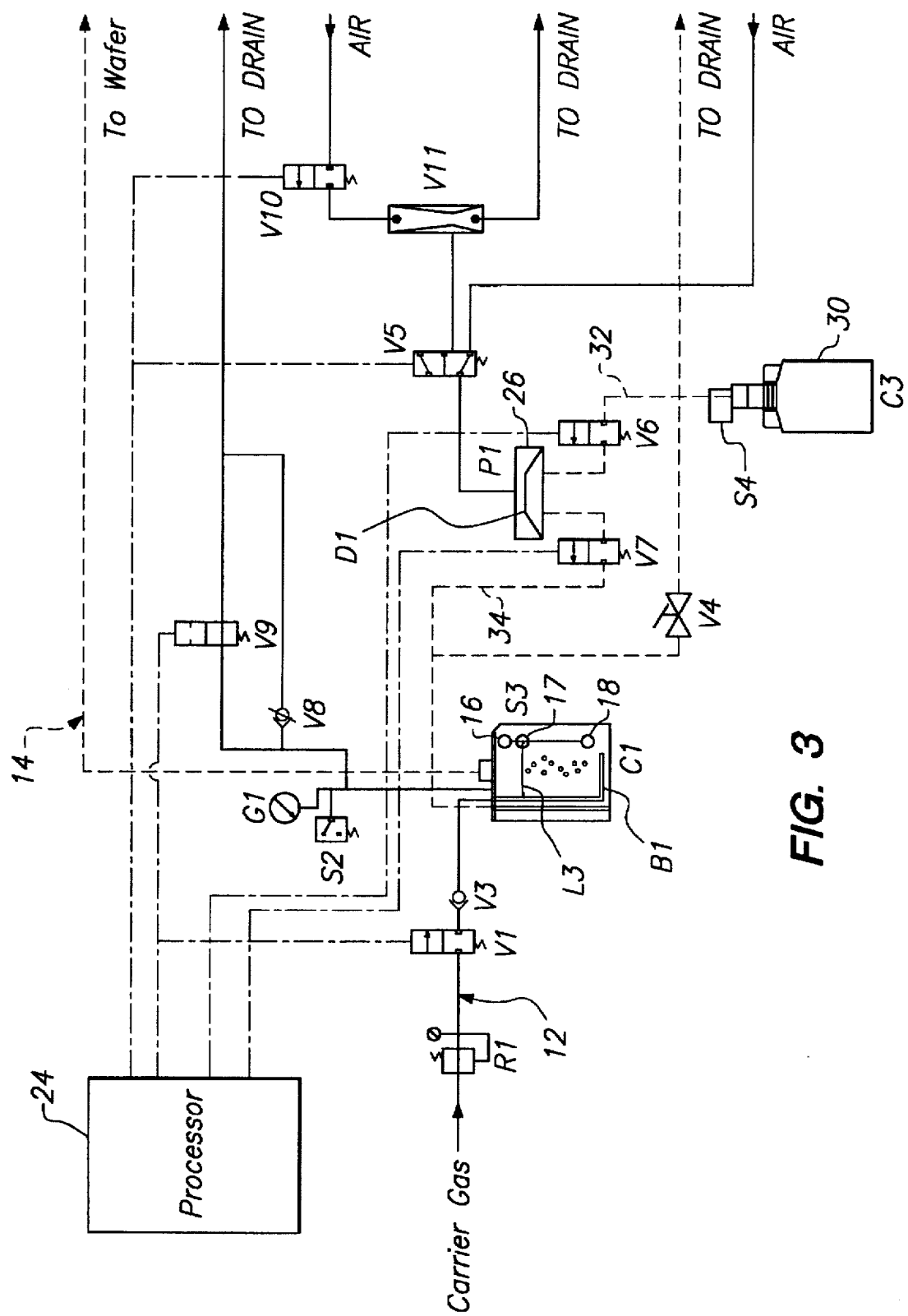
FIG. 3 is a schematic of an HMDS tank control system according to an embodiment of the invention.

A second embodiment is described with reference to FIG. 3. This embodiment is similar to the first embodiment, and includes additional details. Tank 10 is where the carrier gas is bubbled through the liquid HMDS. The carrier gas is pressure regulated by regulator R1 and it is delivered to tank 10 through gas tube 12 which has an on/off control via valve V1. While, FIG. 3 shows regulator R1 as a mechanical operator-controlled device, regulator R1 can also be an electromechanical device controlled by processor 24 to approximately 5–15 pounds per square inch. A check valve V3 is included on line 12 to ensure that no liquid HMDS can backflow if there are unexpected pressure situations. The carrier gas enters tank 10 via tube 12 into a "bubbler" B1 which is located near the bottom of the tank 10 and below the normal HMDS surface level.

The pressurization of the carrier gas causes it to "bubble" through "bubbler" B1 and then pass through the liquid HMDS. The carrier gas bubbles begin to become concentrated with HMDS as they rise through the HMDS liquid. When the carrier gas has completed its passage through the HMDS liquid, it accumulates at the top of tank 10 and then the concentrated carrier gas travels through tube 14 to the integrated circuit fabrication process area where the HMDS concentrated carrier gas is used to cleanse the semiconductor wafers.

The HMDS surface level slowly falls as the carrier gas bubbles through the HMDS, becomes concentrated with HMDS and flows out through tube 14. When the HMDS surface level falls below optimal level sensor 17, a fill sensor signal is sent to processor 24, which commands pump 26 to add HMDS to tank 10. The additional HMDS in tank 10 causes the liquid HMDS surface level to rise. When the HMDS surface level reaches optimal level sensor 17, a full sensor signal is sent to processor 24 indicating that the HMDS surface level is satisfactory. Processor 24 responds to the full sensor signal by commanding pump 26 to halt. Additional level sensors such as high sensor 16 and low sensor 18 are used to ensure safe operating conditions are maintained at all times. For example, these additional sensors detect overflow and low liquid conditions. Software in processor 24 is constructed to optimize the auto-leveling in tank 10. Since the system is a positive feedback system, processor 24 takes into account that adjustments need time to settle and therefore acts slowly to perform the adjustments.

The processor generated command to operate pump 26 also includes associated commands to other valves that assist in the hydraulic and pneumatic functions of pump 26. Pump 26 selected for this implementation uses a single diaphragm to move the liquid HMDS. The implementation illustrated uses a valve V5 to switch between air pressure and vacuum on a driving diaphragm D1. When air pressure is placed on diaphragm D1, the HMDS is forced into tank 10. When vacuum is drawn on diaphragm D1, HMDS is forced into pump 26 due to the atmospheric pressure on the HMDS liquid HMDS reserve tank 30. Additionally, pump 26 has an inlet valve V6 and an outlet valve V7. These valves are coordinated by processor 24 to ensure the flow of the liquid HMDS is from the reserve tank 30 to tank 10. Valve V10 is used to control air flow through a venturi V11 which generates the necessary vacuum to drive pump 26.

The pumping function can be provided by other pump designs. The current implementation provides a high degree of control over the fluid flow and turbulence when refilling HMDS tank 10. A flow through sensor S4, detects when HMDS reserve tank 30 of HMDS liquid. When this situation occurs, an electronic signal is sent to processor 24. Processor 24 then ensures that pump 26 and its associated valves do not operate further since there is no more HMDS liquid to transport. Also, processor 24 generates an alarm to request that HMDS reserve tank 30 is refilled by manual or automatic means.

Pneumatic circuits are installed to prevent over pressurization situations which could cause damage. Check valve V8 prevents excessive pressure from building up inside tank 10. Computer controlled valve V9 allows maintenance personnel to relieve pressure in tank 10 when service is required. Pressure gauge G1 and pressure switch S2 provide visual and computer readable pressure status respectively.

CONCLUSION

An advantage of the invention includes a substantially constant HMDS level that in turn provides a substantially constant concentration of HMDS in the carrier gas which is delivered to the integrated circuit fabrication process. Additional advantages include increased integrated circuit fabrication up-time, reduced contamination and improved efficiency and continuity of the integrated circuit fabrication process. Moreover, the invention avoids human exposure to the HMDS.

Having disclosed exemplary embodiments and the best mode, modifications and variations may be made to the disclosed embodiments while remaining within the scope of the present invention as defined by the following claims.

What is claimed is:

1. A tank apparatus for use in an integrated circuit fabrication process, comprising:

a tank configured to hold a liquid, said tank having a first inlet port configured to receive a carrier gas below a liquid surface level, an outlet port configured to release said carrier gas saturated with said liquid above said liquid surface level and a second inlet port configured to receive said liquid;

a sensor positioned in said tank at a predetermined liquid level and configured to generate a fill sensor signal when said liquid surface level falls below said predetermined liquid level; and a processor coupled to said sensor and configured to generate a fill signal in response to said fill sensor signal to initiate introduction of said liquid into said tank through said second inlet port to maintain said liquid surface level at a substantially constant level and to provide a substantially constant path length for said carrier gas in said liquid in order to maintain a substantially constant concentration of said liquid in said carrier gas.

2. The tank apparatus of claim 1, wherein:

said sensor is configured to generate a full sensor signal when said liquid surface level rises above said predetermined liquid level; and said processor is further configured to generate a halt signal in response to said full sensor signal to halt introduction of said liquid into said tank through said second inlet port.

3. The tank apparatus of claim 1, further comprising:

a low sensor positioned in said tank at a low liquid level and configured to generate an alarm signal when said liquid surface level falls below said low sensor.

4. The tank apparatus of claim 1, further comprising:

a high sensor positioned in said tank at a high liquid level and configured to generate an alarm signal when said liquid surface rises above said high sensor; and wherein said processor is coupled to said high sensor and configured to generate a halt signal in response to said alarm signal to halt introduction of said liquid into said tank through said second inlet port.

5. The tank apparatus of claim 3, further comprising:

a high sensor positioned in said tank at a high liquid level and configured to generate a second alarm signal when said liquid surface rises above said high sensor; and wherein said processor is coupled to said high sensor and configured to generate a halt signal in response to said second alarm signal to halt introduction of said liquid into said tank through said second inlet port.

6. The tank apparatus of claim 1, further comprising:

a liquid reserve tank configured to hold said liquid and having an outlet port; and a pump coupled to said liquid reserve tank outlet port, to said tank apparatus second inlet port, and to said processor; and wherein said processor is configured to activate said pump in response to said fill sensor signal.

7. The tank apparatus of claim 2, further comprising:

a liquid reserve tank configured to hold said liquid and having an outlet port; and a pump coupled to said liquid reserve tank outlet port, to said tank apparatus second inlet port, and to said processor; and wherein said processor is configured to activate said pump in response to said fill sensor signal and to halt said pump in response to said full sensor signal.

8. The tank apparatus of claim 3, further comprising:

a liquid reserve tank configured to hold said liquid and having an outlet port; and a pump coupled to said liquid reserve tank outlet port, to said tank apparatus second inlet port, and to said processor; and wherein said processor is configured to activate said pump in response to said fill sensor signal and to halt said pump in response to said full sensor signal.

9. The tank apparatus of claim 4, further comprising:

a liquid reserve tank configured to hold said liquid and having an outlet port; and a pump coupled to said liquid reserve tank outlet port, to said tank apparatus second inlet port, and to said processor; and wherein said processor is configured to activate said pump in response to said fill sensor signal and to halt said pump in response to said full sensor signal.

10. The tank apparatus of claim 5, further comprising:

a liquid reserve tank configured to hold said liquid and having an outlet port; and a pump coupled to said liquid reserve tank outlet port, to said tank apparatus second inlet port, and to said processor; and wherein said processor is configured to activate said pump in response to said fill sensor signal and to halt said pump in response to said full sensor signal.

11. The tank apparatus of claim 6, further comprising:

a regulator coupled to said processor and said first inlet port and configured to deliver said carrier gas to said tank at a regulated pressure; and wherein said processor is configured to control said regulator to maintain a pressure range of said carrier gas in said tank of approximately 5 to 15 pounds per square inch.

12. The tank apparatus of claim 7, further comprising:

a regulator coupled to said processor and said first inlet port and configured to deliver said carrier gas to said tank at a regulated pressure; and wherein said processor is configured to control said regulator to maintain a pressure range of said carrier gas in said tank of approximately 5 to 15 pounds per square inch.

13. The tank apparatus of claim 8, further comprising:

a regulator coupled to said processor and said first inlet port and configured to deliver said carrier gas to said tank at a regulated pressure; and wherein said processor is configured to control said regulator to maintain a pressure range of said carrier gas in said tank of approximately 5 to 15 pounds per square inch.

14. The tank apparatus of claim 9, further comprising:

a regulator coupled to said processor and said first inlet port and configured to deliver said carrier gas to said tank at a regulated pressure; and wherein said processor is configured to control said regulator to maintain a pressure range of said carrier gas in said tank of approximately 5 to 15 pounds per square inch.

15. The tank apparatus of claim 10, further comprising:

a regulator coupled to said processor and said first inlet port and configured to deliver said carrier gas to said tank at a regulated pressure; and wherein said processor is configured to control said regulator to maintain a pressure range of said carrier gas in said tank of approximately 5 to 15 pounds per square inch.

16. The tank apparatus of claim 1, further comprising:

a liquid reserve tank configured to hold said liquid and having an outlet port; and a fluid transfer structure coupled to said liquid reserve tank outlet port, to said tank apparatus second inlet port, and to said processor; and wherein said processor is configured to activate said fluid transfer structure in response to said fill sensor signal.

17. The tank apparatus of claim 2, further comprising:

a liquid reserve tank configured to hold said liquid and having an outlet port; and a fluid transfer structure coupled to said liquid reserve tank outlet port, to said tank apparatus second inlet port, and to said processor; and wherein said processor is configured to activate said fluid transfer structure in response to said fill sensor signal.

18. The tank apparatus of claim 3, further comprising:

a liquid reserve tank configured to hold said liquid and having an outlet port; and a fluid transfer structure coupled to said liquid reserve tank outlet port, to said tank apparatus second inlet port, and to said processor; and wherein said processor is configured to activate said fluid transfer structure in response to said fill sensor signal.

19. The tank apparatus of claim 4, further comprising:

a liquid reserve tank configured to hold said liquid and having an outlet port; and a fluid transfer structure coupled to said liquid reserve tank outlet port, to said tank apparatus second inlet port, and to said processor; and wherein said processor is configured to activate said fluid transfer structure in response to said fill sensor signal.

20. The tank apparatus of claim 16, further comprising:

a regulator coupled to said processor and said first inlet port and configured to deliver said carrier gas to said tank at a regulated pressure; and wherein said processor is configured to control said regulator to maintain a pressure range of said carrier gas in said tank of approximately 5 to 15 pounds per square inch.

* * * * *